(12) United States Patent
Valori et al.

(10) Patent No.: US 10,228,483 B2
(45) Date of Patent: Mar. 12, 2019

(54) TOOLS FOR USE IN OBSERVATION WELLS

(71) Applicant: SCHLUMBERGER TECHNOLGOY CORPORATION, Sugar Land, TX (US)

(72) Inventors: Andrea Valori, Dammam (SA); Mohammed Badri, Al-Khobar (SA); Reza Taherian, Missouri City, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 270 days.

(21) Appl. No.: 15/027,116

(22) PCT Filed: Oct. 2, 2014

(86) PCT No.: PCT/US2014/058843
§ 371 (c)(1),
(2) Date: Apr. 4, 2016

(87) PCT Pub. No.: WO2015/051129
PCT Pub. Date: Apr. 9, 2015

(65) Prior Publication Data
US 2016/0238734 A1  Aug. 18, 2016

Related U.S. Application Data

(60) Provisional application No. 61/886,812, filed on Oct. 4, 2013.

(51) Int. Cl.
*G01V 3/32* (2006.01)
*G01R 33/50* (2006.01)
(Continued)

(52) U.S. Cl.
CPC ............ *G01V 3/32* (2013.01); *E21B 47/0905* (2013.01); *G01R 33/50* (2013.01); *G01V 3/30* (2013.01)

(58) Field of Classification Search
None
See application file for complete search history.

(56) References Cited

U.S. PATENT DOCUMENTS

| 6,177,794 B1 | 1/2001 | Stoefﬂ |
| 6,249,259 B1 * | 6/2001 | Goodman ................ H01Q 7/08 340/854.6 |

(Continued)

OTHER PUBLICATIONS

Kleinberg, Robert L. et al., "An Introduction to the History of NMR Well Logging," Concepts in Magnetic Resonance, vol. 13, No. 6, pp. 340-342, 2001.

(Continued)

*Primary Examiner* — Jermele M Hollington

(57) ABSTRACT

A permanent monitoring tool is provided and disposed in a wellbore. Measurements are made at different times using the permanent monitoring tool on a region of a formation penetrated by the wellbore. One or more properties of the formation are inferred at one or more depths of investigation within the region using the measurements. Any changes in the one or more inferred formation properties are determined and one or more reservoir management decisions are made based on the determined changes. The well may be an observation well, an injector well, or a production well. The permanent monitoring tool may be a magnetic resonance tool or an electromagnetic tool. The measurements may be stacked to improve the signal-to-noise ratio of the signal. Different depths of investigation may be selected using antenna arrays of different lengths. The inferred properties may be saturation or resistivity. Conductive or non-conductive casing may be used.

22 Claims, 11 Drawing Sheets

(51) Int. Cl.
*E21B 47/09* (2012.01)
*G01V 3/30* (2006.01)

(56) References Cited

U.S. PATENT DOCUMENTS

| | | | |
|---|---|---|---|
| 6,366,086 B1 | 4/2002 | Sen | |
| 2002/0000808 A1* | 1/2002 | Nichols | G01V 3/28 324/339 |
| 2004/0180793 A1* | 9/2004 | Ramos | C04B 24/003 507/200 |
| 2009/0167302 A1* | 7/2009 | Edwards | G01V 3/32 324/303 |
| 2011/0199228 A1* | 8/2011 | Roddy | E21B 33/13 340/856.4 |

OTHER PUBLICATIONS

Hertrich, Marian, "Imaging of Groundwater With Nuclear Magnetic Resonance," Progress in Nuclear Magnetic Resonance Spectroscopy, vol. 53, No. 4, pp. 227-248, 2008.
Roy, J. et al., "The Magnetic Resonance Sounding Technique and Its Use for Groundwater Investigations," Hydrogeology Journal, vol. 11, No. 4, pp. 455-465, 2003.
Shushakov, Oleg A, "Surface NMR Measurement of Proton Relaxation Times in Medium to Coarse-grained Sand Aquifer," Magnetic Resonance Imaging, vol. 14, No. 7-8, pp. 959-960, 1996.
Shushakov, Oleg A. et al, "Surface-NMR Relaxation and Echo of Aquifers in Geomagnetic Field," Applied Magnetic Resonance, vol. 25, No. 3-4, pp. 599-610, 2004.
Shushakov, Oleg A., "Groundwater Nmr in Conductive Water," Geophysics, vol. 61, No. 4, pp. 998-1006, 1996.
Bonner, Steve, "Resistivity while drilling—images from the string", Oilfield Review (Published by Schlumberger), Spring 1996, vol. 8, Issue 1, pp. 4-19.

* cited by examiner

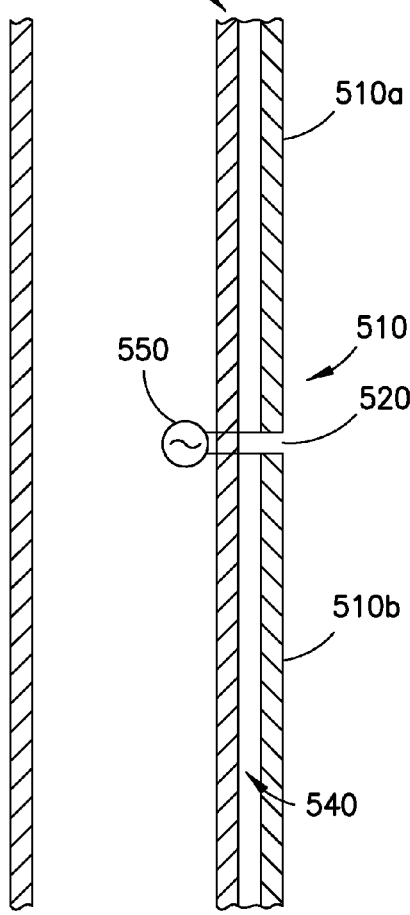
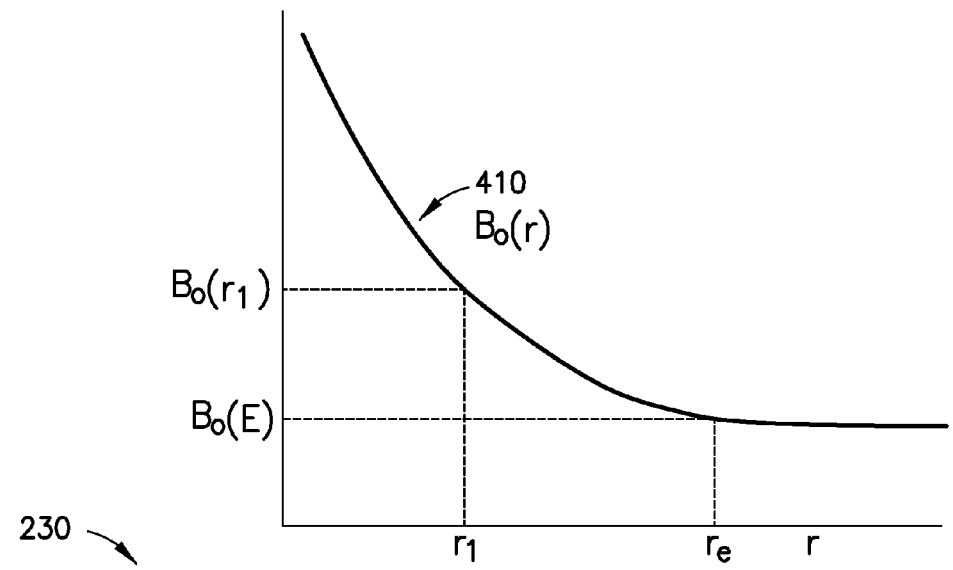
FIG.4
FIG.5

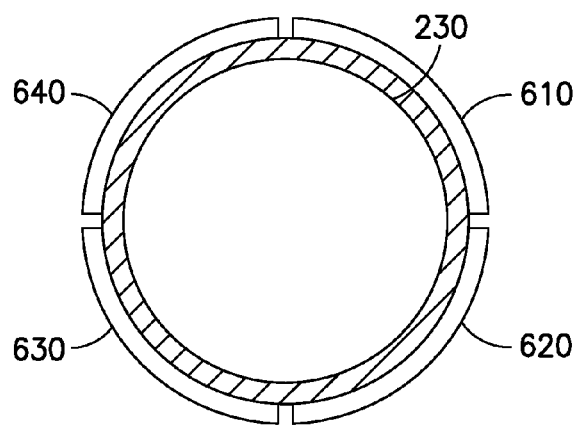
FIG.6
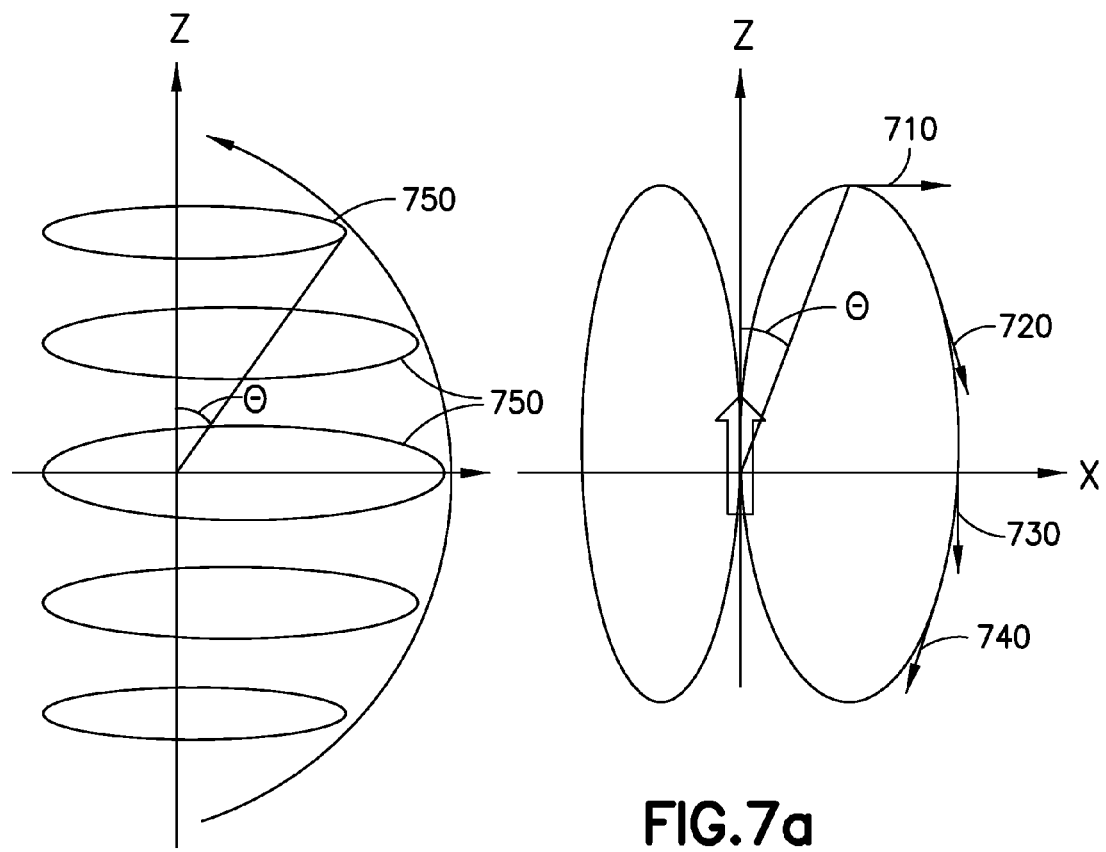
FIG.7b
FIG.7a

TOOLS FOR USE IN OBSERVATION WELLS

CROSS-REFERENCE TO RELATED APPLICATIONS

This application claims, under 35 U.S.C. § 119, priority to and the benefit of U.S. Provisional Patent Application No. 61/886,812, filed Oct. 4, 2013.

BACKGROUND OF THE DISCLOSURE

Logging tools have long been used in wellbores to make, for example, formation evaluation measurements to infer properties of the formations surrounding the borehole and the fluids in the formations. Common logging tools include electromagnetic tools, nuclear tools, and nuclear magnetic resonance (NMR) tools, though various other tool types are also used.

Early logging tools were run into a wellbore on a wireline cable, after the wellbore had been drilled. Modern versions of such wireline tools are still used extensively. However, the need for information while drilling the borehole gave rise to measurement-while-drilling (MWD) tools and logging-while-drilling (LWD) tools. MWD tools typically provide drilling parameter information such as weight on the bit, torque, temperature, pressure, direction, and inclination. LWD tools typically provide formation evaluation measurements such as resistivity, porosity, and NMR distributions. MWD and LWD tools often have components common to wireline tools (e.g., transmitting and receiving antennas), but MWD and LWD tools must be constructed to not only endure but to operate in the harsh environment of drilling.

Electromagnetic tools generally use either magnetic dipole antennas, in which case they are based on induction physics, or they use electrodes (electric dipole antennas) to inject current into the formation. Typically, particularly for electromagnetic measurements, a signal originates from a tool disposed in the interior of an uncased wellbore, passes through the formation outside the wellbore, and returns to a receiver within the wellbore. Because the signal travels through the formation, certain properties of the formation can be inferred from the measurement. Measurements are typically performed in an uncased portion of the wellbore because conventional conductive casing tends to limit the electromagnetic signal that can pass between the interior and exterior of a cased wellbore. This is not necessarily an issue when a well is being drilled since measurements can be made prior to setting the casing, but presents a challenge should one wish to re-enter an existing cased wellbore to make updated measurements.

Nuclear Magnetic Resonance (NMR) tools used for well-logging or downhole fluid characterization measure the response of nuclear spins in formation fluids to applied magnetic fields. NMR tools typically have a DC magnet that produces a static magnetic field at a desired test location (e.g., where the fluid is located). The static magnetic field produces a magnetization in the fluid. The magnetization is aligned along the direction of the static field. The magnitude of the induced magnetization is proportional to the magnitude of the static field. A transmitter antenna produces a time-dependent radio frequency magnetic field that has a component perpendicular to the direction of the static field. The NMR resonance condition is satisfied when the radio frequency is equal to the Larmor frequency, which is proportional to the magnitude of the static magnetic field. The radio frequency magnetic field produces a torque on the magnetization vector that causes it to rotate about the axis of the applied radio frequency field. The rotation results in the magnetization vector developing a component perpendicular to the direction of the static magnetic field. At resonance between the Larmor and transmitter frequencies, the magnetization is tipped to the transverse plane (i.e., a plane normal to the static magnetic field vector). A series of radio frequency pulses are applied to generate spin echoes that are measured with the antenna.

NMR measurements can be used to estimate, among other things, sample porosity. For example, the area under the curve of a T2 distribution for a NMR measurement can be equated to or at least provides an estimate of the NMR-based porosity. The T2 distribution may also resemble the pore size distribution in water-saturated rocks. The raw reported porosity is provided by the ratio of the initial amplitude of the raw decay and the tool response in a water tank. This porosity is independent of the lithology of the rock matrix.

SUMMARY

A permanent monitoring tool is provided and disposed in a wellbore. Measurements are made at different times using the permanent monitoring tool on a region of a formation penetrated by the wellbore. One or more properties of the formation are inferred at one or more depths of investigation within the region using the measurements. Any changes in the one or more inferred formation properties are determined and one or more reservoir management decisions are made based on the determined changes. The well may be an observation well, an injector well, or a production well. The permanent monitoring tool may be a magnetic resonance tool or an electromagnetic tool. The measurements may be stacked to improve the signal-to-noise ratio of the signal. Different depths of investigation may be selected using antenna arrays of different lengths. The inferred properties may be saturation or resistivity. Conductive or non-conductive casing may be used.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Embodiments are described with reference to the following figures. The same numbers are generally used throughout the figures to reference like features and components.

FIG. 4 is a plot showing the magnetic field intensity $B_0$ as a function of distance from the center of the magnet and into the formation, in accordance with the present disclosure.

FIG. 5 shows an electric dipole antenna, in accordance with the present disclosure.

FIG. 6 is a plan view of an embodiment in which four dipole antennas are constructed on the same casing, in accordance with the present disclosure.

FIGS. 7*a* and 7*b* depict representative field lines and patterns for embodiments of the subject disclosure, in accordance with the present disclosure.

DETAILED DESCRIPTION

Figure 1:
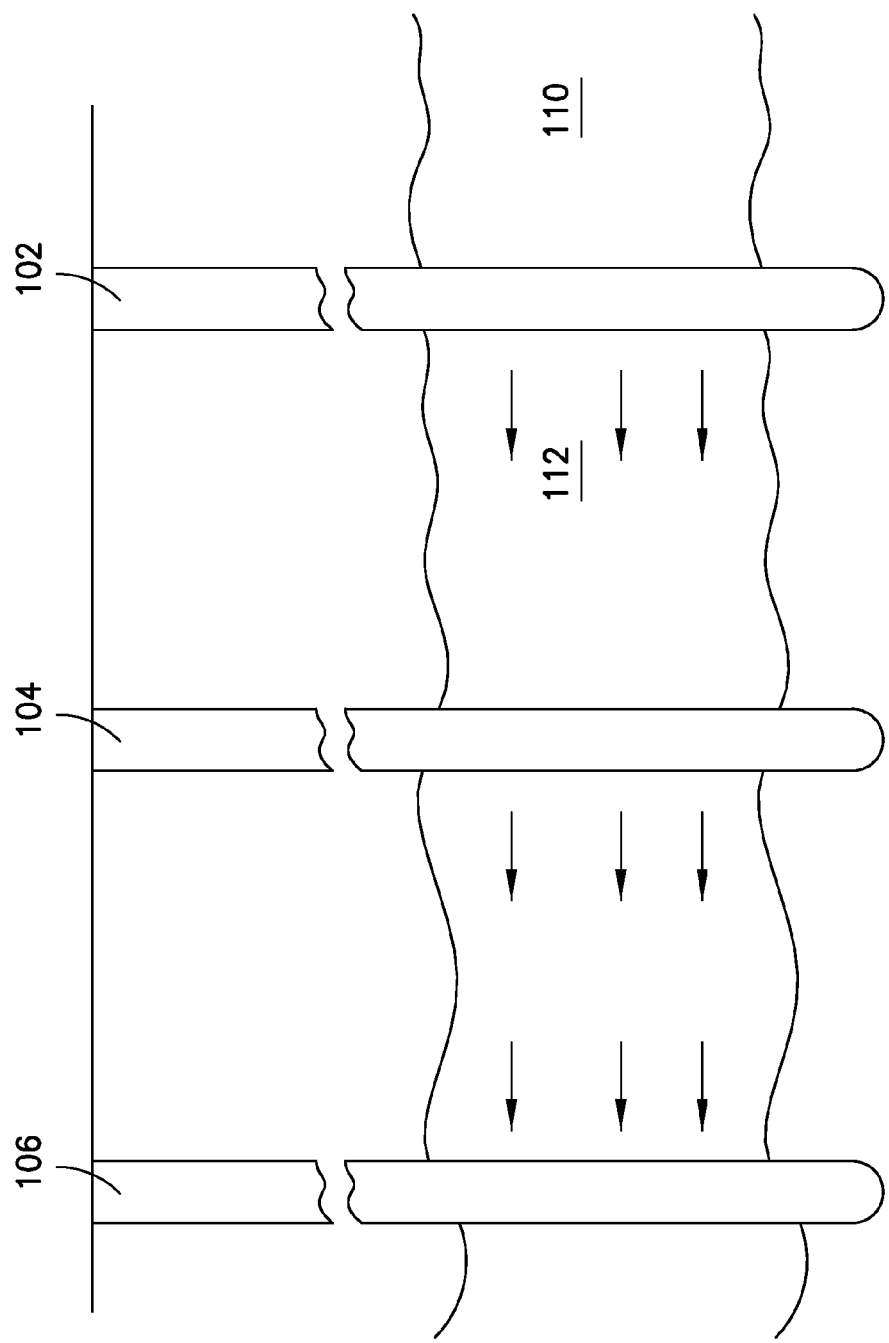
FIG. 1 is a schematic drawing of a formation showing a layer of interest into which an injection well, an observation well, and a production well have been drilled, in accordance with the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Some embodiments will now be described with reference to the figures. Like elements in the various figures may be referenced with like numbers for consistency. In the following description, numerous details are set forth to provide an understanding of various embodiments and/or features. However, it will be understood by those skilled in the art that some embodiments may be practiced without many of these details and that numerous variations or modifications from the described embodiments are possible. As used here, the terms "above" and "below", "up" and "down", "upper" and "lower", "upwardly" and "downwardly", and other like terms indicating relative positions above or below a given point or element are used in this description to more clearly describe certain embodiments. However, when applied to equipment and methods for use in wells that are deviated or horizontal, such terms may refer to a left to right, right to left or diagonal relationship, as appropriate. It will also be understood that, although the terms first, second, etc. may be used herein to describe various elements, these elements should not be limited by these terms. These terms are only used to distinguish one element from another.

The terminology used in the description herein is for the purpose of describing particular embodiments only and is not intended to be limiting. As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

A system and method to use a magnetic resonance (MR) tool and/or an electromagnetic (EM) tool in an observation well is disclosed. Various embodiments are described to make nuclear magnetic resonance (NMR) or electromagnetic measurements having large depths of investigation from within an observation well, though the system and method are not limited to use in observation wells. For example, they can also be used in injection wells and production wells. The NMR or EM tools disclosed herein may be used as permanent sensors for observation purposes. In this disclosure, we first discuss the use of a magnetic resonance tool, and then present the use of an electromagnetic tool.

To aid and improve oil production, it is common to inject water into a reservoir, thereby forcing the oil to move into a wellbore from which it may be produced. This is known as water flooding and is done after the primary recovery phase is over. The primary recovery phase is that period in which the oil generally flows of its own accord as a result of existing pressures in the formation. Water flooding is performed by injecting water into an injection well, forcing the oil to be displaced away from the injection well and toward one or more production wells. The location of the water front and the flow rate of the injected water are important parameters in reservoir management and may be used to adjust and optimize the water injection rate. Low flow rates may have negative economic consequences, while high flow rates may bypass the oil, making it even more difficult to recover later on.

Knowledge of the water front movement is sufficiently important to justify the drilling of observation wells in strategic locations between the injection well(s) and the production well(s) so that the water front may be monitored. FIG. 1 shows a layer of interest 110 in a formation in which an injection well 102, an observation well 104, and a production well 106 have been drilled. Water is injected into formation layer 110 from injection well 102 and moves away from injection well 102, toward production well 106, as shown by the arrows 112. The observation well 104 may be used to monitor the formation properties as a function of time. The observation wells are generally cased to ensure they have minimum impact on the fluid distribution and its time dependence.

Figure 2:
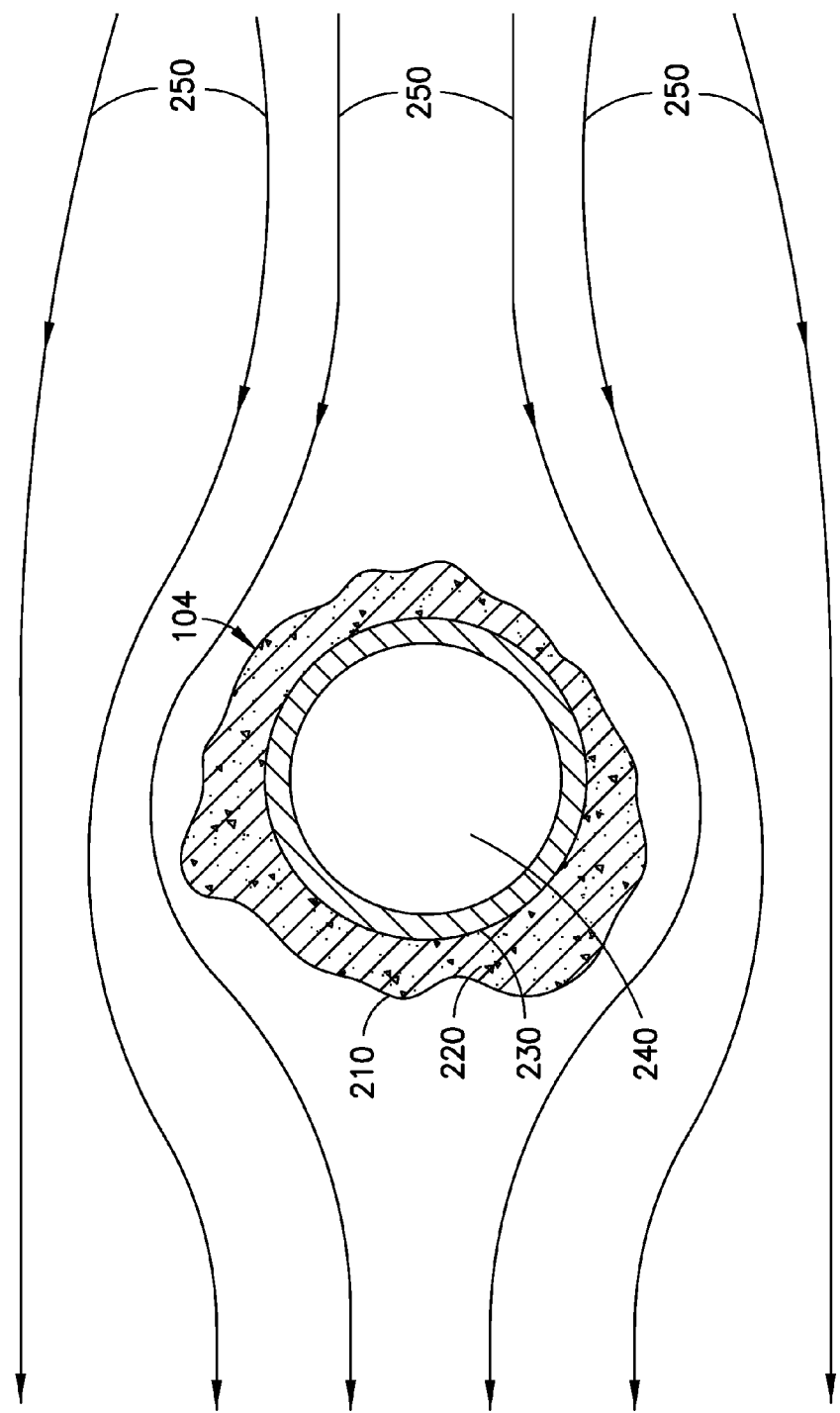
FIG. 2 is a plan view of the observation well of FIG. 1.

FIG. 2 shows a plan view of the observation well 104 as drilled, along with the casing 230 bound to the borehole wall 210 by the cement layer 220. The figure also shows arrows 250 indicating the water flow paths and how those flow paths become distorted as they encounter the non-permeable discontinuity in the formation presented by the cased wellbore of observation well 104. Different measurement devices may be lowered into observation well 104 on a regular basis (e.g., once every few months) to make time dependent measurements of the formation around the well from which different parameters, including water saturation, may be estimated.

Those devices have a relatively shallow depth of investigation and, at best may provide an indication of the change in the water saturation once the water front has moved to or past the observation well location. In addition, in most estimation methods, there is an inherent but unrealistic assumption that the observation well 104 does not perturb the fluid flow. However, as FIG. 2 shows, observation well 104 generally affects the fluid flow to different extents based on the distance from the borehole location. At large distances (i.e., on the order of a few feet) from observation well 104, the effect is negligible. However, in the region close to the borehole (on the order of a few inches), the effect can be significant, leading to erroneous conclusions by tools having shallow depths of investigation (e.g., overestimates the actual water saturation). This disturbance makes the validity of some of the shallow measurements somewhat questionable and motivates the need for observation tools that have deep enough depths of investigation to look beyond the perturbation zone caused by the presence of the observation well 104. The deeper depth of investigation also allows for the earlier detection of the water front.

One distinction between a logging tool and an observation tool (OT) is the signal-to-noise ratio requirements. Logging tools typically move at a rate of hundreds of feet per hour while making measurements that are either not affected by or are corrected for tool movement during the measurement. As such, logging tools generally provide a measurement with a large enough signal-to-noise ratio to be usable with limited measurement time, as dictated by the tool movement. In contrast, a permanently positioned observation tool can use, for example, signal averaging and stack the measurements to achieve the desired signal-to-noise ratio and does not necessarily have to have a high signal-to-noise ratio for the actual measurements. The ability to signal average for a relatively long time is an additional degree of freedom that may be considered when designing a tool, and can be used to achieve a greater depth of investigation. Thus, while deeper depths of investigation normally lead to weaker signals, an observation tool can be designed to have a deeper depth of investigation because its measurements can be stacked to boost the signal-to-noise ratio to a desired level. Stacking over long periods is generally acceptable since the processes monitored by observation tools normally change slowly. For example, a water front typically moves at a rate of a few centimeters per day.

A magnetic resonance tool is typically designed for a depth of investigation on the order of ten meters. To generate a NMR signal one may provide a DC magnetic field ($B_0$) and a perpendicular AC magnetic field ($B_1$). The interaction between the two fields produces a signal that the associated electronics acquire, process, and report. For the perpendicular AC magnetic field ($B_1$), the antenna part of the tool is generally an electric dipole that, in one embodiment, may be built on or near the outer surface of a casing before the casing is installed into the observation well. Thus, the length of the electric dipole can be some desired multiple of the length of a casing section. A casing section is normally about 10 meters long.

For the DC magnetic field ($B_0$), the earth's magnetic field or a permanent magnet that provides a gradient magnetic field may be used (or both may be used in conjunction). The magnetic field intensity decays as a function of radial distance from the borehole into the formation. The permanent magnet may be used to vary the depth of investigation of the tool and provide radial profiling results. The magnetic field from the permanent magnet may also be used to increase the Larmor frequency of the spin sources (e.g., protons) close to the borehole, making them non-resonant when the frequency is chosen to correspond to other depths of investigation. In addition, when the magnitude of this field falls below a certain limit, the frequency can be adjusted to correspond to the earth's magnetic field. If desired, the tool may be capable of generating the radio frequency (RF) magnetic field $B_1$ at variable frequencies, thus making it possible to use the tool at varying depths of investigation or at different (geographical) locations where the earth's magnetic field is different. Furthermore, the tool may be capable of projecting the RF pulses in a particular direction or modulating the phase, duration, and/or amplitude of the RF pulses to allow spatial resolution.

Figure 3:
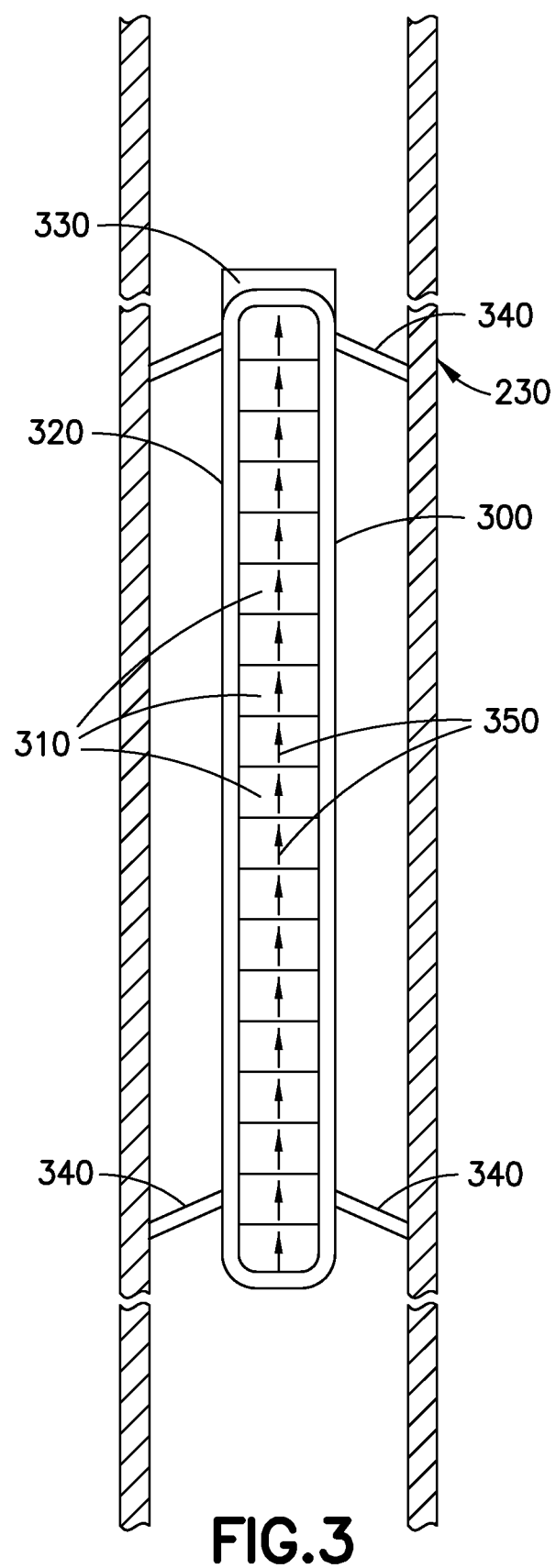
FIG. 3 depicts a magnet assembly disposed in an observation well, in accordance with the present disclosure.

In one embodiment of this disclosure, a permanent magnet material is used to produce $B_0$ in the formation. The permanent magnet material is typically SmCo or NdBFe, both of which are commercially available. An NdBFe magnet has a higher magnetic field strength at normal earth surface temperatures than that of SmCo, but at temperatures above about 100° C., its magnetic field strength decreases more rapidly than that of SmCo. Either material can be used for temperatures below 100° C. The material can be machined to a desired shape and then magnetized. The magnet 300 in the embodiment of FIG. 3 is cylindrical, having a diameter smaller than the inner diameter of the casing 230 so that it can pass into the well. The cylinder may have any desired length, but may be as long as the length of the antenna (multiples of casing section length) or longer. The magnet 300 in FIG. 3 has been drawn to be as long as one casing section length, but, if desired, the magnet cylinder can be made longer than the length of the antenna. The longer magnet length helps make the magnetic field more homogeneous in the region of investigation.

The magnet cylinder may be attached to and deployed with the casing 230, or it may be deployed after the casing is installed and cemented. FIG. 3 shows multiple magnet material disks 310 disposed inside a non-magnetic housing 320. The magnet 300 is placed in the center of the casing 230. Centralizers 340 may be used to hold and center the magnet housing 320 relative to the casing 230. The housing 320 is attached at attachment link 330 to an insertion tool (not shown) that brings housing 320 to a desired depth in the observation well and may also be used to activate the centralizers 340. Each disk 310 may have an opening through its center to allow wiring to pass through to accommodate situations such as when the NMR tool is to be used above other tools. Similarly, the bottom or top of the housing 320 can be attached to other tools that are located above or below housing 320. The magnet assembly of FIG. 3 can be made of multiple sections that attach together to comprise a longer magnet 300. The direction of the $B_0$ magnetic field is a design parameter and is decided in conjunction with the intended direction of the RF $B_1$ magnetic field. In the embodiment of FIG. 3, the direction of the magnetization is designed such that each magnet disk 310 is equivalent to a magnetic dipole 350 oriented along the longitudinal axis of the housing cylinder 320. In another embodiment the magnet 300 may be off-centered or shielded in one direction to make the NMR measurements directional.

FIG. 4 shows a plot of magnetic field intensity $B_0$ as a function of distance from the center of the magnet into the formation (i.e., in the radial direction, r). The decay curve 410 is the vector sum of the magnetic field from the magnet 300 and the earth's magnetic field, and starts at high magnetic field strength, but decays as the radial distance increases, usually as $1/r^2$. At smaller r values the contribution from the permanent magnet 300 is dominant, but at large enough r values this contribution becomes negligible and $B_0$ becomes substantially independent of r. Thus, beyond a depth ($r_e$), the magnetic field is (for practical purposes) constant and equal to the earth's magnetic field at that location. Therefore, in this embodiment the NMR tool can be used to select any depth of investigation up to a limit that is set by the signal-to-noise ratio.

The resonance frequency in NMR tools is set using the following relation:

$$\omega(r)=\gamma_H B_0(r) \qquad (1)$$

where $\gamma_H$ denotes the gyromagnetic ratio of the spin source (e.g., proton) and $\omega$ is the angular frequency used by the NMR tool. The radial dependence of $B_0$ is emphasized and leads to the radial dependence of tool frequency. For example, if a depth of investigation of $r_1$, as shown in FIG. 4, is desired, then $B_0(r_1)$ is used in Eq. 1. Likewise, if a frequency corresponding to $B_0(r_e)$ is used, the depth of investigation will be equal to or greater than $r_e$.

A magnet made of SmCo showed $B_0$ equal to two gauss at a depth of investigation of 1.5 meters, which corresponds to a frequency of 8.516 kHz. The same magnet showed $B_0$ equal to 0.2 gauss at a depth of investigation of five meters (or a total $B_0$ of 0.2+0.5=0.7 gauss, assuming the field from the magnet and the earth are aligned). The 0.2 gauss field at the five meter distance due to magnet 300 is roughly half the magnitude of the earth's magnetic field and is not yet negligible. However, the magnet 300 showed a $B_0$ that is ten times smaller than the earth's magnetic field at a depth of investigation of 10 meters. These values suggest a value for $r_e$ of approximately 8 meters for this case. As a result, it is possible to use a frequency of about two kHz for the regions with $B_0$ close to the earth's magnetic field and thereby providing depths of investigation greater than about 8 meters.

In a further embodiment, an electromagnet can be used to provide $B_0$. The electromagnet provides the freedom to change the extent of the magnetic field as desired. It can also be used to modulate the magnetic field strength for some applications.

As stated above, in at least one embodiment the antenna for generating $B_1$ is an electric dipole antenna. As shown in FIG. 5, the electric dipole antenna 510 is made of two (metal) pieces 510a and 510b which are positioned on the outside of the casing 230. There is a gap 520 between the two parts of antenna 510 to electrically isolate pieces 510a, 510b. A current source 550 is connected to the two parts of antenna 510 and can inject electrical current into the two pieces 510a, 510b.

The construction of the antenna depends on the electrical conductivity of the casing 230 over which these conductive poles 510a, 510b are assembled. If the casing 230 is substantially non-conductive, which is becoming more commonplace in observation wells, the (metal) conductors 510a, 510b can be directly attached to casing 230. This arrangement is easier to manufacture, but such an antenna design may generate a $B_1$ field inside the casing as well as outside. That is, when the inside of the casing is filled with one or more fluids that are capable of producing a NMR signal, care must be taken to avoid having that signal mix with that obtained from the formation. The casing 230 may be conductive (metallic, for example). In that case, a layer of insulation 540 is placed between the casing 230 and the conductors 510a, 510b to prevent electrical shorting between casing 230 and the two poles 510a, 510b. With this design, there is no (or little) $B_1$ field generated inside the casing 230, but the efficiency of the antenna 510 may be somewhat reduced, depending on the thickness of layer 540. A thicker layer 540 will have the least detrimental effect on the efficiency of the antenna. In a further embodiment, insulating casing can be used for mechanical strength and for supporting the conductive poles 510a, 510b, along with a thin conductive (e.g., metal) layer deposited on the internal diameter of the insulating casing to reduce the $B_1$ field intensity inside the insulating casing.

The two poles 510a, 510b may have substantially semi-circular shapes and be disposed on one side of casing 230. This may provide more sensitivity on the side where pieces 510a, 510b are located and makes the antenna semi-directional. In some applications this configuration may be desirable. For example, such an embodiment may be installed so that the pieces 510a, 510b are in the direction from which the water front is expected to arrive.

Multiple dipole antennas 510 may be constructed on the outside of the casing 230. As an example, FIG. 6 shows a plan view of an embodiment in which four dipole antennas 610, 620, 630, and 640 are constructed on the same section of casing 230 (though that is not required). The conductors (i.e., poles) making up those four antennas 610, 620, 630, 640 are arcs of slightly less than 90 degrees. In another embodiment, the arc angles of the multiple antennas 610, 620, 630, 640 are not all the same and, depending on the directional preference, they can be made larger or smaller. When multiple antennas are constructed on the same casing, it is possible to use one current source and switch the current among the different antennas. Also, in operation, when a large signal is expected, the antennas 610, 620, 630, 640 can be used individually to obtain directional information. However, when the signal level is too low, a subset of the multiple antennas may be combined to enhance signal level. As an example, before a water front reaches the sensitive region of the NMR tool, the antennas looking (facing) in the expected direction of water front arrival may be combined to look for any faint indication of water front arrival. Once the water front is detected, the antennas can be used individually to monitor the spatial variation of the water front movement.

An electric dipole along the z axis (i.e., vertical or longitudinal electric dipole) is equivalent to a magnetic dipole in the x-y plane. Representative electric field lines of a longitudinal electric dipole are shown in FIG. 7a. Equations for the electric field (E) and the corresponding magnetic field (H or equivalently, $B_1$) of the electric dipole are given below (using spherical coordinates):

$$\vec{E} = \hat{\theta} \frac{jk\sqrt{\frac{\mu}{\varepsilon}} e^{-jkr}}{4\pi r} \sin(\theta) U(\theta) \quad (2)$$

$$\vec{H} = \hat{\phi} \frac{jke^{-jkr}}{4\pi r} \sin(\theta) U(\theta) \quad (3)$$

$$U(\theta) = \int_{-h}^{h} I(z) e^{jkz\cos(\theta)} dz \approx I(0)h \quad (4)$$

$$k = \frac{2\pi f}{C} \sqrt{\varepsilon_r \mu_r} \quad (5)$$

Here j is the imaginary unit, f is the frequency, c is the speed of light in vacuum, μ is the magnetic permeability, and s is the dielectric permittivity of the medium. The dipole is assumed to be along the z-axis and extend from −h to zero for one of the conductors (poles) and from 0 to +h for the other. The dipole is assumed to be excited by a current I(0) at the origin, and along the length of the dipole the current is not constant but is a function of z. Thus, we use I(z) in Eq. 4. The limiting approximation shown in Eq. 4 corresponds to cases in which the length of the conductor (pole) is much less than the wavelength of the operational frequency of the tool. For example, frequencies in the kHz range, which correspond to wavelengths on the order of kilometers, are much longer than the length of the antenna (e.g., 10 m) and the approximation is justified.

Note from Eq. 3 the magnetic field is in the φ direction at every point. At particular values of θ and r, it forms circular field lines 750 around the dipole (assuming the conductors are sufficiently narrow). The field strength along various circular field lines 750 depends on the multiplicative factor sin(θ) such that, for a particular value of r, the $B_1$ at z=0 (i.e., θ=90 degrees) has the highest intensity. The intensity drops as |θ| increases and eventually goes to zero at (θ=0, 180 degrees) (i.e., along the z axis). Note all the circular magnetic field lines point in the φ direction, but their intensities are modulated by sin(θ).

Figure 8:
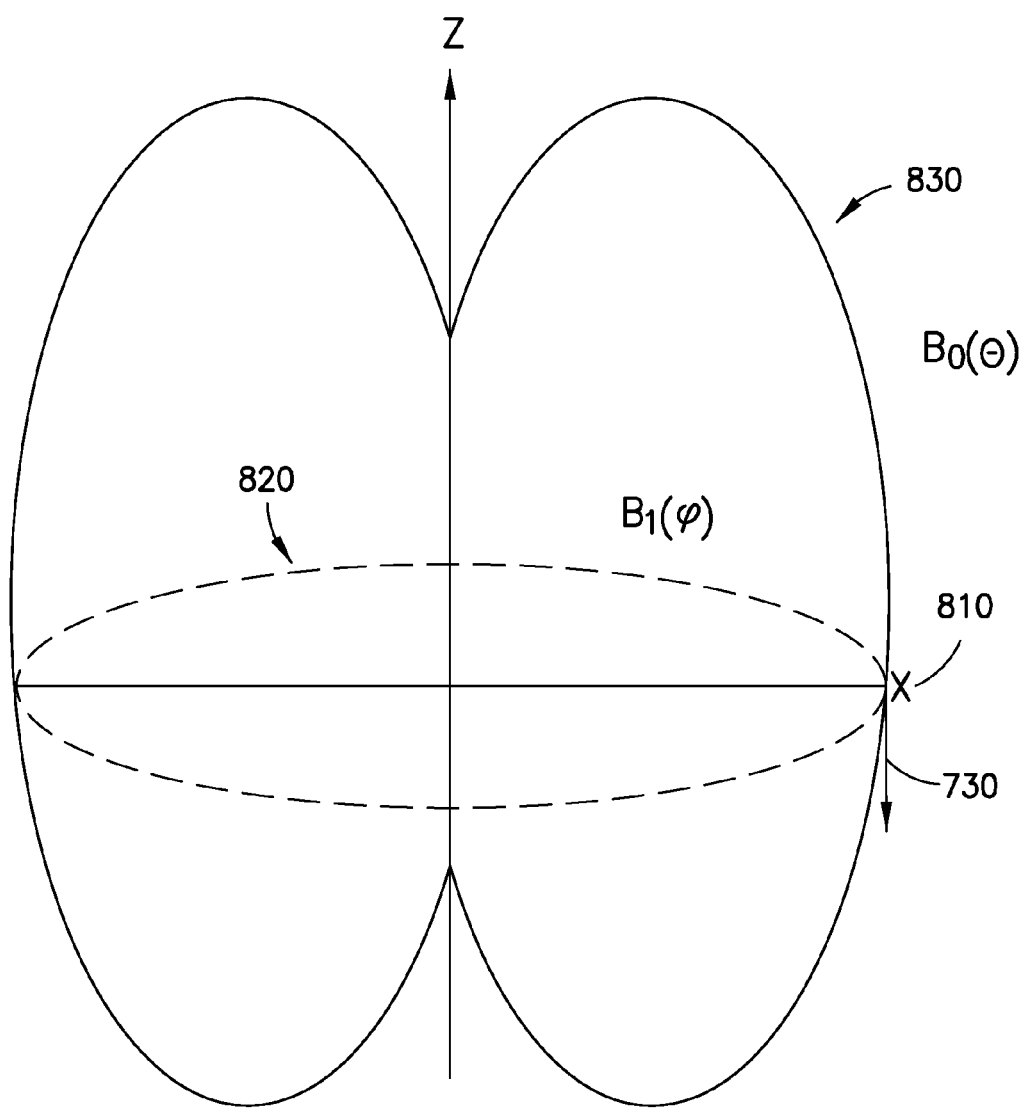
FIG. 8 schematically shows a selected, single contour of $B_0$ and a selected, single contour of $B_1$, in accordance with the present disclosure.

Turning to $B_0$ now, as FIG. 3 shows, each magnet disc 310 is equivalent to a magnetic dipole along the z axis (assumed to be along the direction of the well). The vector sum of these individual dipoles is a larger magnetic dipole also along the z axis. The magnetic field pattern of a z-directed magnetic dipole is the same as the electric field pattern of a z-directed electric dipole (shown in FIG. 7a). $B_0$ is always along the θ direction as shown in FIG. 7a. The direction of $B_0$ varies with θ and is shown at selected points as arrows 710, 720, 730, and 740 in FIG. 7a. Thus, $B_0$ is oriented along the θ direction while $B_1$ is oriented along the φ direction. Since these two directions are perpendicular to each other at every point in space, $B_0$ and $B_1$ have optimum orientations with respect to each other. Selected, single contours of $B_0$ and $B_1$ are shown in FIG. 8. The $B_1$ field line 820 is a circular contour with B1 oriented in the φ direction at each point. The $B_0$ field line 830 resembles that of a bar magnet (or electric dipole) and the magnetic field is oriented along the θ-direction, which at the point 810 points downward. $B_1$ points into the page at the point 810 (indicated by X). The figure shows their perpendicularity. This satisfies an important requirement for maximum NMR signal: all else being equal, the maximum NMR signal is obtained if $B_0$ and $B_1$ are perpendicular to each other at the location of the spin source.

As alluded to above, the antenna may be manufactured on a section of casing. After the well is drilled and ready to be cased, the casing section with the antenna is incorporated into the casing string at a desired location. The casing is cemented in place and the tool is assembled. If the electronics are not already in place and connected, they may be lowered to their proper location and a connection made. Also, if the magnet 300 is not already in place, it may be delivered to and positioned at the correct depth. A desired depth of investigation may be selected by choosing the corresponding Larmor frequency and knowing the magnetic field strength as a function of radial distance.

The operation of the NMR tool involves broadcasting a sequence of pulses in a pre-selected pulse sequence. The most common of those sequences are T2 measuring pulse sequences such as CPMG, T1 measuring pulse sequences such as inversion recovery, and diffusion measuring sequences such as diffusion editing. Depending on the desired measurement type, a pulse sequence is selected, loaded into the supporting electronics, and measurements are made. Because a single measurement typically takes a few seconds, often the same measurement is repeated many times and those measurements are averaged to yield a result with a higher signal-to-noise ratio. The data can be processed using standard methods of data analysis commonly used in oil well logging. These results, for example, can provide water saturation, which may be slowly increasing due to oil production (reduction of oil saturation). The results may be monitored for an accelerated increase in water saturation, which can be taken as the arrival of a water front. Once an event such as an approaching water front is detected, the tool can continue monitoring the water front or it can switch to making more spatially resolved measurements if it is equipped with segmented antennas as described above.

The NMR signal is inversely proportional to the depth of investigation. There is an interplay of a few factors that leads to this loss of signal with increasing depth into the formation. One such factor is the dependence of the signal level on $B_1$ intensity. As $B_1$ is radiated from the antenna, which is located in the borehole, its magnitude decays as a function of depth of investigation and thus the RF pulses needed to generate a NMR signal have to be made longer. A longer pulse leads to a $B_1$ pulse with smaller frequency bandwidth, thus a thinner layer of the formation is resonated, leading to a smaller signal level. The effect of RF pulse bandwidth is demonstrated in FIG. 9. This figure shows, via the curve 910, the dependence of $B_0$ as a function of depth of investigation (DOI). Also shown in this figure is how a constant $B_1$ bandwidth translates into a constant bandwidth in $B_0$ through Eq. 1 above. When the tool operates at $B_0 = B_{01}$, the NMR echo is generated at a DOI equal to $r_1$. As the boundaries 922 and 924 show, the RF pulse causes the $B_0$ from 922 to 924 to resonate, which translates to a resonance region with width of $\Delta r_1$. However, if $B_0$ has the same width, but operates at $B_0 = B_{02}$, as the figure shows, it leads to a wider resonance region $\Delta r_2$. As this figure shows, if the reduction in $B_1$ is compensated for by supplying more power to the antenna, such that the RF pulses have the same width, the $B_1$ bandwidth remains the same, which leads to a thicker resonance volume.

The depth of investigation has a similar effect on the echo intensity. An echo signal, generated at a deeper depth of investigation, has to travel farther to reach the antenna to be detected. But as the echo signal travels through the formation, it decays due to the conductivity of the formation and geometrical spreading.

A third factor is the reduction of $B_0$ with depth of investigation. $B_0$ is responsible for generating magnetization as it causes the nuclear spin levels to break their degeneracy.

For nuclei with spin ½, for example, there are two spin levels and the splitting of these two energy levels is proportional to $B_0$, as can be seen from Eq. 1. For the same temperature, as the energy level splitting becomes larger (i.e., higher $B_0$), the Boltzmann factor causes the population difference (i.e., the nuclear magnetization) to become larger. Of course, larger magnetization translates into larger NMR signal.

Figure 9:
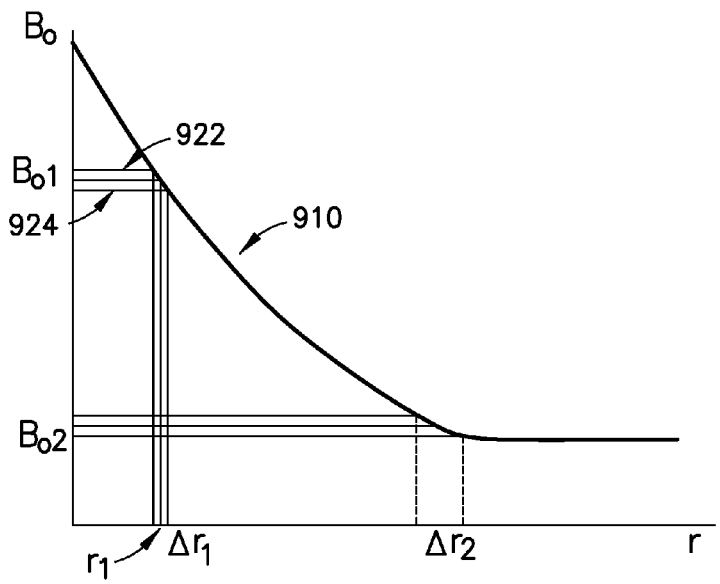
FIG. 9 is a plot showing the effect of RF pulse bandwidth on thickness of depth of investigation, in accordance with the present disclosure.

In an embodiment of the subject disclosure at least three approaches may be used to cope with the signal level reduction. Firstly, a larger power may be applied to the antenna to cause $B_1$ to be proportionally larger for deeper depths of investigation. As depicted in FIG. 9, this will lead to a thicker resonance volume and partly compensate for the loss of signal intensity. Since the tool does not have to make continuous measurements, the electrical energy can be accumulated in the rest period, making more electrical energy available for the measurement period.

Figure 10:
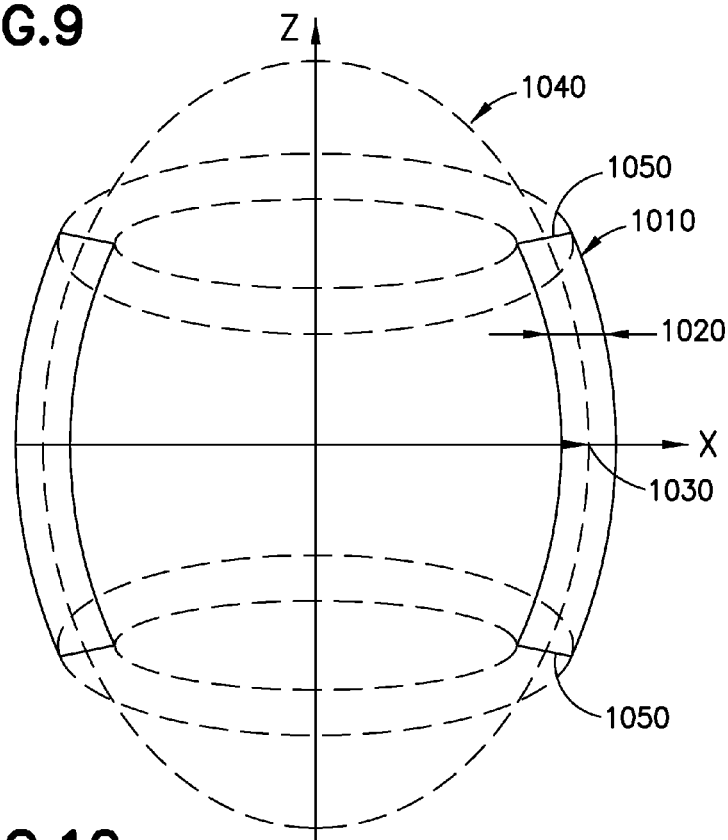
FIG. 10 schematically depicts a NMR signal originating from a barrel-like boundary, in accordance with the present disclosure.

Second, the sensor part of the tool can be made larger. The sensitive region of a tool is shown in FIG. 10. In this figure the dashed line 1040 shows the depth of investigation, which has a $\sin(\theta)$ dependence, as per Eq. 3. The signal intensity is not constant along the entire length of line 1040. It is largest around a circle in the x-y plane with radius out to point 1030. It decreases both in the upward and downward direction in the figure so that the signal may be negligible past upper and lower points 1050. Therefore, only the signal between upper and lower points 1050 is considered as contributing to the NMR signal. To line 1040 a width 1020 has been drawn to account for the $B_1$ bandwidth as discussed in FIG. 9. Assuming circular symmetry, the NMR signal originates from a barrel-like boundary, as shown in FIG. 10. The total signal is proportional to the width of this barrel, which is controlled by the $B_1$ bandwidth and the height of the barrel, which is controlled by the length of the sensor. If both of those parameters are maximized, that may help offset or diminish the signal level reduction due to the large depth of investigation of the tool.

Thirdly, the response of the tool does not have to be very fast and signal averaging may be used to boost the signal-to-noise ratio. As discussed above, since this is a stationary tool and the medium being investigated does not change too fast, it is possible to make many measurements and signal average to improve the signal-to-noise ratio.

It is common in the field of NMR logging to invert the NMR data to obtain formation properties such as transverse relaxation time (T2), longitudinal relaxation (T1), and diffusion (D). Any of those or any combination of those properties can be used to infer the onset, movement, and distribution of an event such as a water front or enhanced oil recovery (EOR) agent.

A resistivity tool may also be used in observation wells. The resistivity tool may be constructed on the casing used in the observation well. The tool is made very long with varying depths of investigation (DOIs) ranging from shallow to deep. The deepest DOI measurement is used to detect the onset of an event such as a water front approaching the observation well. Once detected, the shallower DOI measurements can be used to monitor the movement of the front progressively.

Referring back to FIG. 1, recall an observation well 104 has been drilled to monitor different processes accompanying movement of fluids. Observation well 104 is drilled somewhere between injector well 102 and production well 106. When a fluid is injected from injector well 102 into the formation, it flows in the direction shown by arrows 112, and at some point it passes by observation well 104. Thus, the speed, shape, and location of the moving fluid can be monitored by measurement devices placed in or around observation well 104.

The operating environment of an observation well 104 is generally characterized by processes that have very slow time dependencies. One such process may be the gradual decrease in oil saturation and corresponding increase in water saturation that occurs as oil is produced from the well. During the secondary recovery phase, the process may be the appearance and movement of a water front associated with a water flooding operation. During this process water is injected via an injector well 102 into a formation and the water tends to move through the formation in the shape of a front and in the direction of lower pressure, which is toward a production well 106. (The water flood may move faster in portions of the formation having streaks of higher permeability material relative to other materials comprising the formation. This leads to "fingering".) The water front moves into the vicinity of the observation well 104 and passes by it, and thus can be monitored at that time.

Yet another example is when chemicals injected for tertiary or enhanced oil recovery pass by the observation well 104. These processes are relatively slow and move on the order of a few centimeters per day provided they are approaching the region around the observation well 104 in a substantially uniform manner. On some occasions, fingering may occur, in which case the movement of the fluids is not uniform, but rather it moves faster through some streaks as mentioned above. Even though the speed of fluid movement in the fingers is faster than in the background, it is still generally slow enough that it is possible to be measured by the observation well tools.

The relatively slow speed of fluid movement allows for improvement of the signal-to-noise ratio of the measurement. As described above, given enough time, a measurement can be performed repeatedly and the results can be averaged to improve the signal-to-noise ratio. It is well known that signal-to-noise ratio improvement is proportional to the square root of the number of measurements being averaged. Thus, the larger the number of measurements being averaged, the more improvement in the signal-to-noise ratio, making it possible to work with the smaller signal-to-noise measurements resulting from deeper DOIs. The casing in an observation well 104 provides a platform for mounting a measurement tool. Since the tool is not moving, it can be made longer than similar tools designed for open-hole logging. The longer length of the tool can be used to increase the DOIs. Of course, deeper DOIs translate into weaker signals. However, the signal averaging described above can remedy the problem and may be used to increase the signal-to-noise ratio to an acceptable level. This technique is also known as signal stacking or summing. In addition, the frequency of operation of the tool may be reduced to increase the DOI, but that does not particularly help improve the signal-to-noise ratio.

Commercially available resistivity logging tools operate at a maximum DOI of roughly five meters. To increase the DOI, the spacing between the transmitter and receiver antennas may be made longer, but this results in longer tools. When the tools are made longer, issues such as mechanical strength of the tool become important and may limit the size of the tool. The mechanical issues arise because the tool must be moved in the borehole. However, that limitation does not exist for permanently installed resistivity tools in injector, producer, or observation wells. Such tools may be built as part of the casing and installed with the casing and therefore do not suffer from that particular mechanical limitation.

Observation wells are generally cased and cemented to make sure they do not provide a region of lower pressure that can change the flow paths from the injector to production wells, perturbing the fluid front. The casing may be conductive (e.g., metallic) or non-conductive (e.g., non-metallic). An example of a non-conductive casing material is fiberglass. It can be designed with enough mechanical strength to withstand the stresses normally present in a borehole. The embodiments of monitoring tools described herein can work with either of the two types of casing material. In the case of non-conductive casing, the antennas can be built directly on the inside or outside of the casing. In the case of conductive casing, a layer of non-conductive material can be applied to the outside of the casing such that the antenna, when attached to the casing, is electrically isolated from the conductive casing. The non-conductive layer separates the antenna from the conductive casing, substantially preventing any detrimental effects of the conductive casing on the operation of the antenna. Those effects may include electrical shorting, producing an image current, or producing eddy currents, all of which can reduce the efficiency of the antenna.

Figure 11:
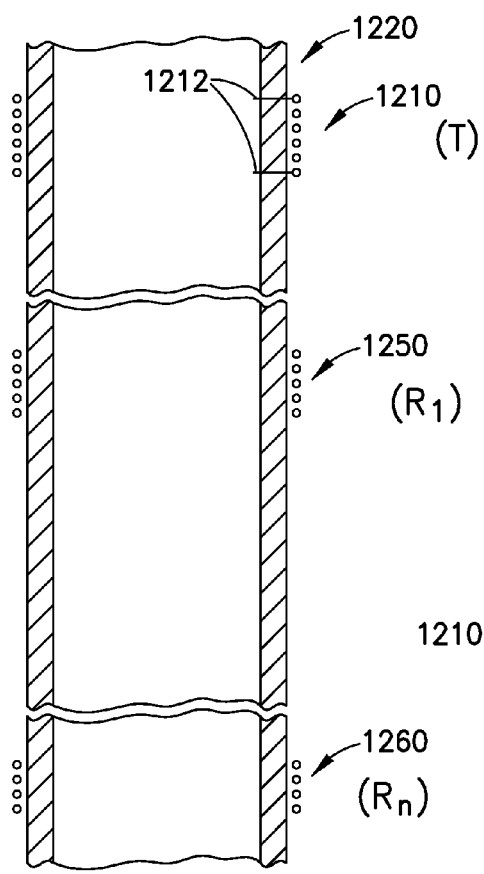
FIG. 11 is a cross-sectional view of a casing having antennas on its outer surface, in accordance with the present disclosure.

In the embodiment shown in FIG. 11, a transmitter antenna 1210 is located on the outer surface of casing 1220. In the following, we will describe coil windings such as are commonly used for antennas in induction tools, but electrodes tools can be similarly made (see FIG. 5, for example; however focused electrode device designs are also contemplated. In this case there may be a current injection section in the middle with a long section above and another section below to focus the current. The focusing is done by keeping the electric potential of the focusing sections and that of the current injecting section substantially the same). The coil is wound on the outside of casing 1220 before inserting casing 1220 into the borehole and cementing it in place. The ends of the windings 1212 pass through the casing wall and are accessible from inside the casing 1220. If the casing 1220 is conductive, one or more insulating "feed thru's" can be used to ensure the current is not shorted to the ground (through the conductive casing).

In the example of FIG. 11, there is one transmitter antenna 1210 and multiple receiver antennas 1250, 1260 (only two are shown for clarity; also bucking coils may be present, but are not shown). The receiver antennas 1250, 1260 are spaced from the transmitter antenna 1210 at different distances to obtain different DOIs. The DOIs are largely controlled by the transmitter/receiver distance and particular design distances should be selected accordingly.

One possible design choice is to use a transmitter/receiver spacing of 10 m which is the length of a casing section. Such a tool will have a nominal DOI of 10 m. In another embodiment, the transmitter and receiver antennas can be on separate casing sections (at least for the deepest DOIs). This allows for the possibility of deeper DOIs that are approximately some multiple of 10 meters. For example, a resistivity tool built on four casing sections (tubes) can have a DOI of 40 meters, which is greater than the DOI of any available resistivity logging tool.

Figure 12:
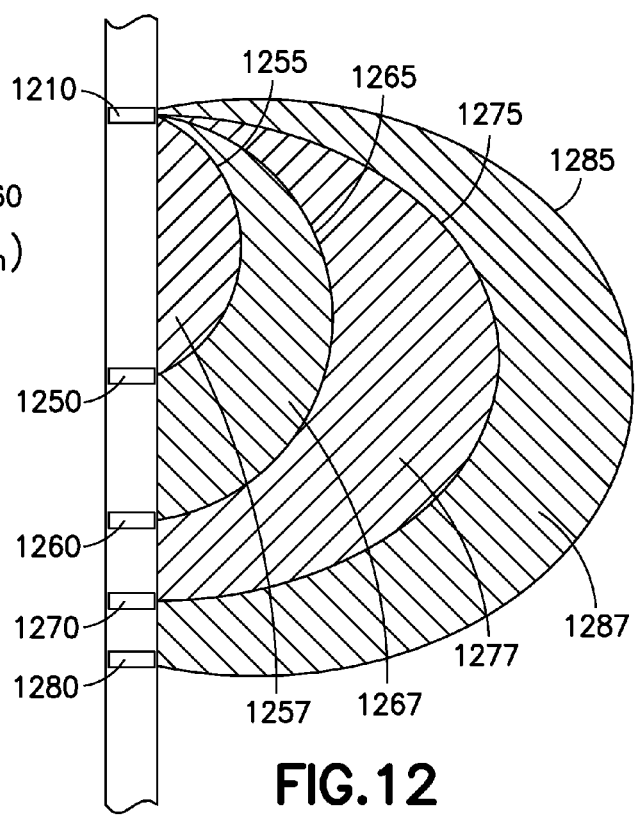
FIG. 12 is a schematic drawing of a tool embodiment having multiple receiver antennas at various distances from a transmitter antenna, in accordance with the present disclosure.

FIG. 12 shows an embodiment of a resistivity tool with four receivers. The transmitter 1210 emits an AC magnetic field that is detected by receivers 1250, 1260, 1270, 1280 spaced, respectively, progressively farther away from the transmitter 1210. The curves 1255, 1265, 1275, 1285 show schematically the ranges of penetration of the AC magnetic field and thereby the DOI of each particular measurement. The figure demonstrates that the shallowest (shortest) array measures an effective resistivity of the formation region 1257 roughly between the tool body (observation well) and the curve 1255. The next array (1210 to 1260) measures the effective resistivity of the formation region (1257 plus 1267) between the tool body and the curve 1265. This same pattern repeats for the other regions. Thus, the measurement from a deeper DOI includes the effective resistivity of the formation from the shallower arrays, plus an additional contribution from a deeper part of the formation. In FIG. 12, the additional contribution for each array is delineated and numbered as 1267, 1277, and 1287, respectively, for each DOI to demonstrate this point.

Figure 13:
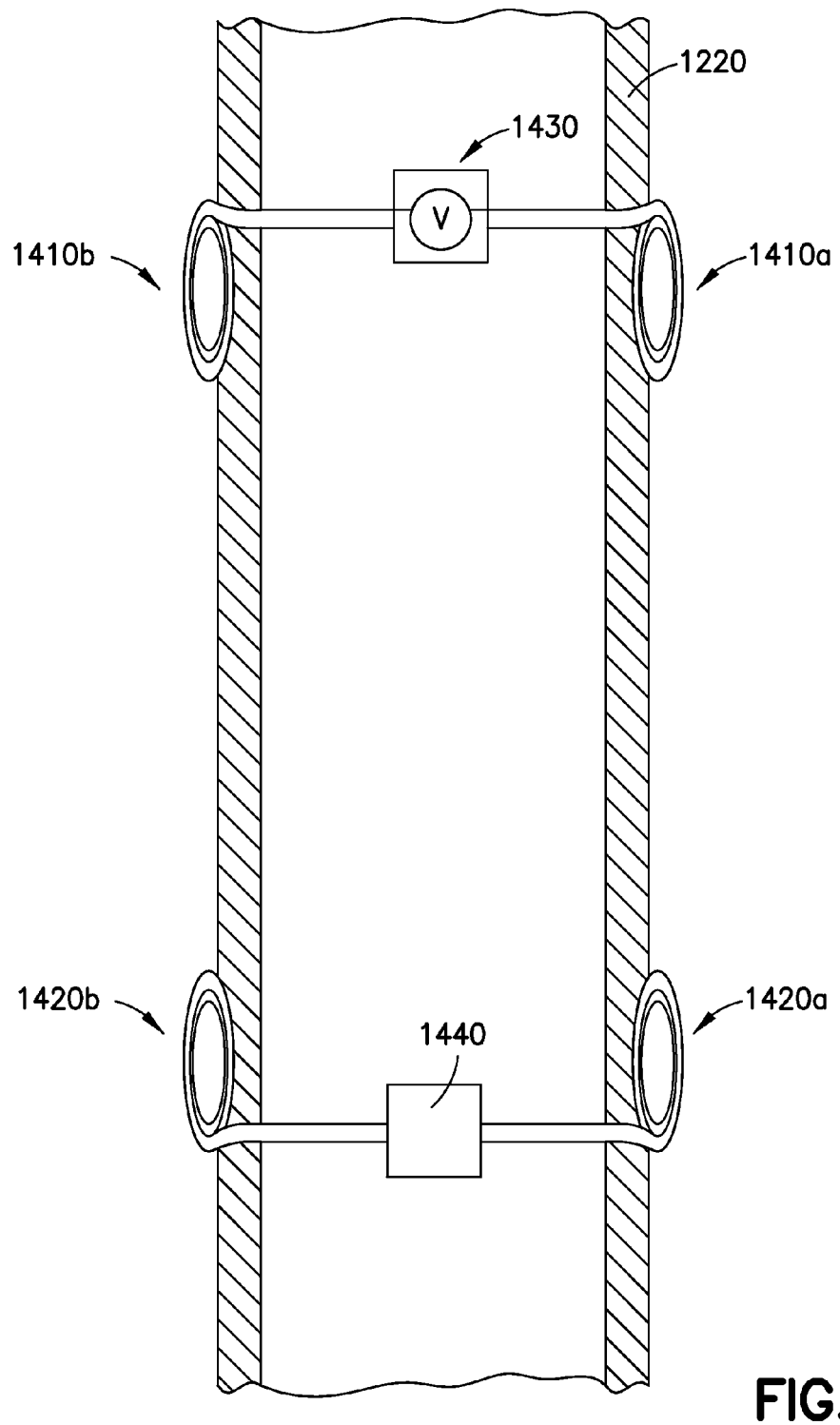
FIG. 13 is a schematic drawing of a tool embodiment having transverse transmitter and receiver antennas, in accordance with the present disclosure.

The tool of FIG. 11 has equal sensitivity in all directions in a plane perpendicular to the axis of the tool, and therefore is not directed in any particular direction. However, in addition to having large spacing between the transmitter and receiver antennas, the tool may be designed to have more directionality. That is, it may make laterally resolved measurements. One embodiment is shown in FIG. 13, wherein the casing 1220 is equipped with transverse coils that are wound on the surface of the casing, rather than or in addition to coils wound around the casing (i.e., z-coil of FIG. 11). Two transmitter coils 1410a and 1410b are shown on opposite sides of the casing 1220 (e.g., along the x-axis). This particular embodiment shows two coils, but different designs are not so limited—more coils can be installed. For example, four coils can be made with 90 degree angular separations that define x and y axes passing through opposite coils. Alternatively, the angle between the coils is not limited to multiples of 90 degrees. In some embodiments the coils may be distributed non-uniformly around the casing 1220. That is, they may be directed more toward the direction where the event is expected to occur. These embodiments provide more directionality to the tool and are more effective in looking in particular directions.

The coils 1410a and 1410b can be excited by the electronics in housing 1430. Coils can be individually excited, or all the coils or a subset of all the coils can be excited substantially at the same time. Exciting more coils provides better signal-to-noise ratio, but generally reduces the lateral resolution. Also shown in FIG. 13, receivers 1420a and 1420b are provided that are connected to electronics in housing 1440. The signal captured by receivers 1420a, 1420b can be recorded individually or in combination. When coil 1410a is excited and the signal is received by coil 1420a, the region adjacent that side of the tool is sampled. The sample region can be selectably altered by using a different receiver. For example, transmitting with coil 1410a and receiving with coil 1420b leads to a sample region that is azimuthally offset from the 1410a/1420a array.

An embodiment may use one or more tilted or transverse antennas, with or without axial antennas. Those antennas may be transmitters or receivers. A tilted antenna is one whose dipole moment is neither parallel nor perpendicular to the longitudinal axis of the tool. A transverse antenna is one whose dipole moment is perpendicular to the longitudinal axis of the tool, and an axial antenna is one whose dipole moment is parallel to the longitudinal axis of the tool. A triaxial antenna is one in which three antennas (i.e., antenna coils) are arranged to be mutually orthogonal. Often one antenna (coil) is axial and the other two are transverse. Two antennas are said to have equal angles if their dipole moment vectors intersect the tool's longitudinal axis at the same angle. For example, two tilted antennas have the same tilt angle if their dipole moment vectors, having their tails conceptually fixed to a point on the tool's longitudinal axis, lie on the surface of a right circular cone centered on the tool's longitudinal axis and having its vertex at that reference point. Transverse antennas have equal angles of 90 degrees, and that is true regardless of their azimuthal orientations relative to the tool.

As stated above, the surface coils of FIG. 13 can be mounted on top of the z-directed coils shown in FIG. 11. This is a common practice in tri-axial resistivity logging and is used to provide the full resistivity tensor of the formation by exciting a coil in one axis and receiving that signal using coils oriented along the three orthogonal directions. That measurement process is repeated for the other directions. Also, in FIG. 13 only one set of receivers is shown, but there can be multiple receiver sets (like 1420a, 1420b). They are generally spaced along the z-axis with different (progressively larger) distances from the transmitter. As mentioned above, this arrangement provides different DOIs.

Having multiple DOIs, it is possible to use some level of processing to extract the formation resistivity as a function of radial depth. Assuming there are no resistivity variations along the length of the borehole (i.e., the formation is homogeneous and there are no bed boundaries close by), the inverted resistivity from each array can be assumed to correspond to the effective resistivity of the formation between the tool face and a radial distance proportional to curves 1255, 1265, 1275, and 1285. It is common in the art of resistivity logging to do a simultaneous inversion of data from all the arrays to produce a radial profile of resistivity with a resolution that is proportional to the number of arrays in the tool. See, for example,
http://www.glossary.oilfield.slb.com/en/Terms/r/radial_processing.aspx
and
http://www.schlumberger.net/~/media/Files/resources/oilfield_review/ors96/spr96/ors96_rwd_p4_19.pdf).

Figure 14:
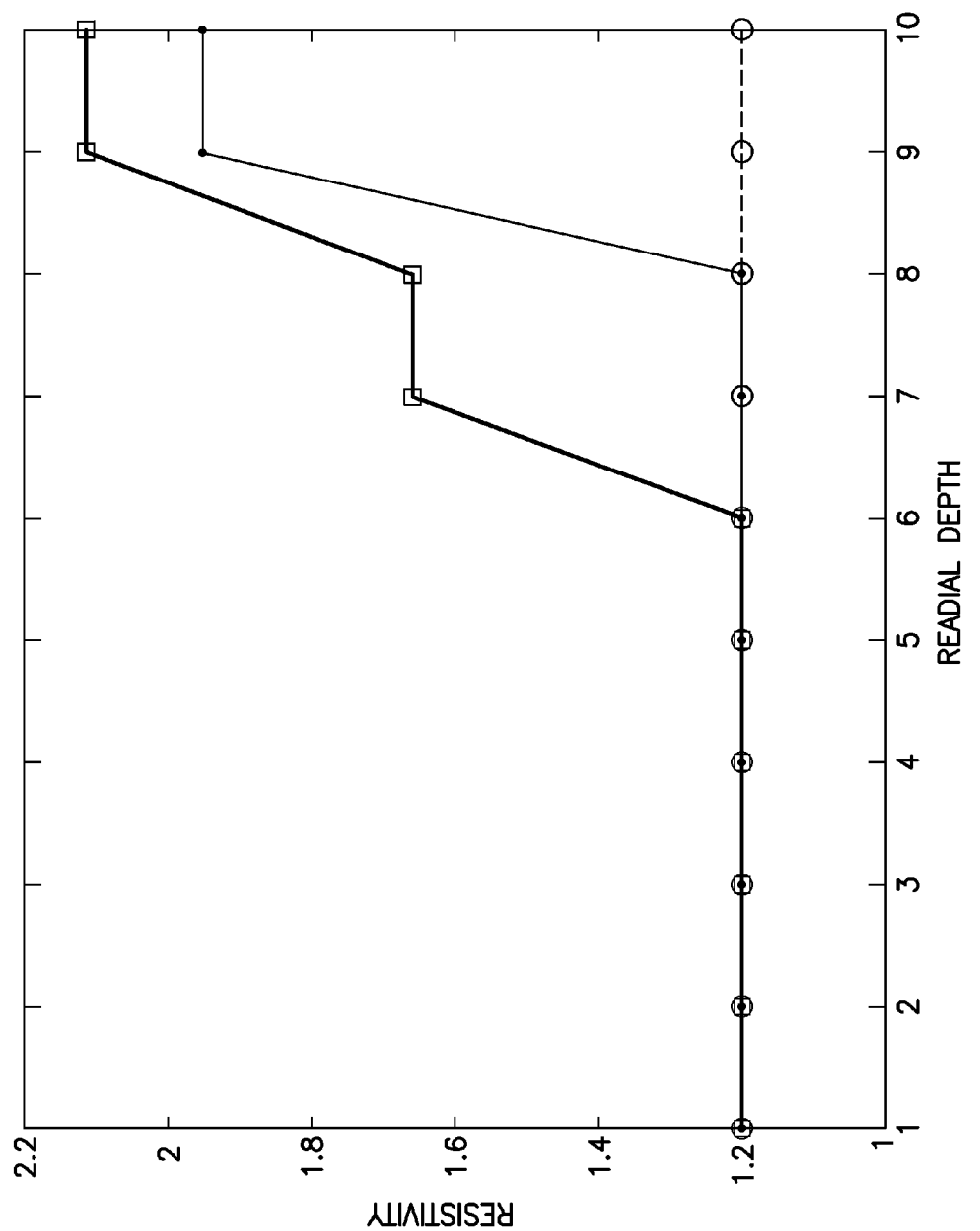
FIG. 14 is a plot showing resistivity measurements made at different times as a front moves through various depths of investigation, in accordance with the present disclosure.

Initially, these measurements are performed and a baseline effective resistivity for the formation around the borehole is obtained. The tool can then be used, either continuously or periodically, to re-measure the effective resistivity and compare the results with the baseline. This can be continued until a difference between the new measurements and the baseline (having intensity above the signal-to-noise ratio of the measurements) is detected. As FIG. 14 shows, the baseline (lower line) is monitored until at some point in time a new (rightmost curve) resistivity is measured that deviates from the background at the deepest DOIs. This deviation signals the onset of a new event such as an approaching water front and the tool can be used more frequently to detect how this deviation develops with time. For example, at a later time the leftmost curve may be obtained, which indicates the front has moved within the range of a shallower DOI array and has mixed with existing fluid to cause a new resistivity. At the same time, more resistive fluid (in this example) has entered into the DOI region of the deeper arrays and has made this measurement even more resistive.

When the system and/or method are used to establish that an event is indeed occurring, we are in the "detection phase". After the detection phase, the system and/or method may be used in the "mapping phase", wherein the resistivity is monitored in greater detail to be able to map the front or any fingering that may occur. In the mapping phase, arrays with more lateral resolution (as described above) may be used to map the front in more detail. The mapping may be done using the raw resistivity curves such as the ones shown in FIG. 14. It may also be more sophisticated and automated by using the resistivity data in an inversion program that extracts more detailed and quantitative information, if desired.

Figure 15:
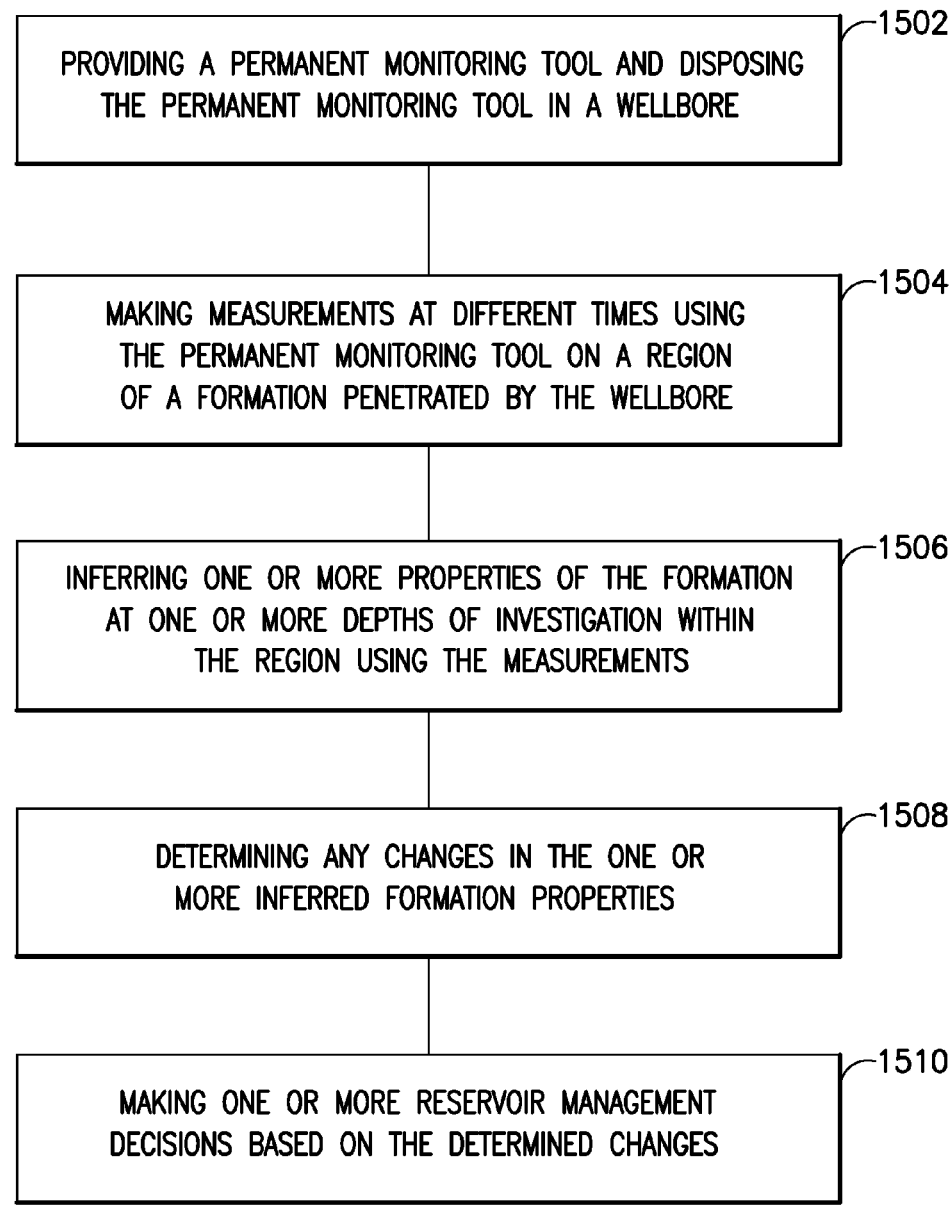
FIG. 15 is a workflow for using a permanent monitoring tool in a well, in accordance with the present disclosure.

FIG. 15 shows a workflow of an embodiment to use a permanent monitoring tool in a wellbore. A permanent monitoring tool is provided and disposed in a wellbore (1502). Measurements are made at different times using the permanent monitoring tool on a region of a formation penetrated by the wellbore (1504). One or more properties of the formation are inferred at one or more depths of investigation within the region using the measurements (1506). Any changes in the one or more inferred formation properties are determined (1508) and one or more reservoir management decisions are made based on the determined changes (1510).

While the embodiments described above particularly pertain to the oil and gas industry, this disclosure also contemplates and includes potential applications such as $CO_2$ storage, underground water detection, geology, monitoring of water content (e.g., swage or landfill leak), environmental spill monitoring, and wherever a long-term monitoring tool for water- or oil-bearing material is required.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the scope of the present disclosure, and that they may make various changes, substitutions, and alterations herein without departing from the scope of the present disclosure.

The Abstract at the end of this disclosure is provided to comply with 37 C.F.R. § 1.72(b) to allow the reader to quickly ascertain the nature of the technical disclosure. It is submitted with the understanding that it will not be used to interpret or limit the scope or meaning of the claims.

While only certain embodiments have been set forth, alternatives and modifications will be apparent from the above description to those skilled in the art. These and other alternatives are considered equivalents and within the scope of this disclosure and the appended claims. Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words 'means for' together with an associated function.

What is claimed is:

1. A method, comprising:
   providing a permanent monitoring tool wherein the permanent monitoring tool includes one or more antennas mounted on an exterior surface of one or more sections of casing wherein each of the one or more antennas comprises two pieces electrically isolated from one another and wherein each of the two pieces circumferentially conforms to the exterior surface of the casing section on which it is mounted;

disposing the permanent monitoring tool in a wellbore;

making measurements at different times using the permanent monitoring tool on a region of a formation penetrated by the wellbore;

inferring one or more properties of the formation at one or more depths of investigation within the region using the measurements;

determining any changes in the one or more inferred formation properties; and making one or more reservoir management decisions based on the determined changes.

2. The method of claim 1, wherein the wellbore is that of a well selected from the group consisting of an observation well, an injector well, and a production well.

3. The method of claim 1, wherein the permanent monitoring tool is selected from the group consisting of magnetic resonance tools and electromagnetic tools.

4. The method of claim 1, wherein the making measurements comprises obtaining information from a signal that has passed through the region.

5. The method of claim 4, further comprising:
stacking the measurements to improve the signal-to-noise ratio of the signal.

6. The method of claim 1, wherein the one or more depths of investigation are selected using antenna arrays of different lengths.

7. The method of claim 1, wherein the one or more inferred properties are selected from the group consisting of T2 distribution, T1 distribution, diffusion, saturation and resistivity.

8. The method of claim 1, wherein determining any changes includes monitoring a reservoir for the advance of and/or passage of a water front.

9. An apparatus, comprising:
one or more sections of casing;
one or more antennas mounted on an exterior surface of the one or more sections of casing wherein each of the one or more antennas comprises two pieces electrically isolated from one another and wherein each of the two pieces circumferentially conforms to the exterior surface of the casing section on which it is mounted; and
a housing containing electronics that are electrically coupled to the one or more antennas.

10. The apparatus of claim 9, wherein the circumferential conformity of each piece of the two pieces has an angular extent in the range of zero to 180 degrees.

11. The apparatus of claim 9, wherein the lengths of the one or more antennas are multiples of a casing section length.

12. The apparatus of claim 9, wherein the one or more antennas are an electrode device design.

13. The apparatus of claim 9, wherein the one or more antennas are coil antennas.

14. The apparatus of claim 13, wherein the coil antennas are selected from the group consisting of: axial antennas, transverse antennas, and tilted antennas.

15. The apparatus of claim 9, wherein the one or more antennas are selected from the group consisting of magnetic dipole antennas, electric dipole antennas, and focused electrode antennas.

16. The apparatus of claim 9, wherein the one or more sections of casing are selected from the group consisting of: conductive casing and non-conductive casing.

17. The apparatus of claim 9, further comprising a magnet inserted into the one or more sections of casing that is as long as or longer than the longest of the one or more antennas.

18. The apparatus of claim 17, wherein the magnet is selected from the group consisting of materials that are or can be magnetized and electromagnets.

19. The apparatus of claim 17, wherein the magnet comprises one or more disks of material that is or can be magnetized.

20. The apparatus of claim 19, wherein each of the one or more disks has a passageway through which a cable may pass.

21. The apparatus of claim 9, wherein the one or more sections of casing are non-conductive, and further comprising a conductive liner mounted to an inner surface of the non-conductive casing.

22. The method of claim 1
wherein the making one or more reservoir management decisions based on the determined changes includes:
making one or more decisions regarding $CO_2$ storage, underground water detection, geology, monitoring of water content, environmental spill monitoring, or long-term monitoring of water-bearing or oil-bearing material.

* * * * *